United States Patent
Gardner et al.

(10) Patent No.: US 6,207,995 B1
(45) Date of Patent: Mar. 27, 2001

(54) HIGH K INTEGRATION OF GATE DIELECTRIC WITH INTEGRATED SPACER FORMATION FOR HIGH SPEED CMOS

(75) Inventors: Mark I. Gardner, Cedar Creek; Dim-Lee Kwong; H. Jim Fulford, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/255,917

(22) Filed: Feb. 23, 1999

(51) Int. Cl.[7] ............... H01L 29/76; H01L 29/94; H01L 31/062; H01L 31/113; H01L 31/119
(52) U.S. Cl. ............... 257/344; 257/408; 437/713
(58) Field of Search ............... 257/410, 344, 257/346, 408, 295, 288, 387, 327, 296; 438/217, 287, 713, 303, 305, FOR 492

(56) References Cited

U.S. PATENT DOCUMENTS

| | | | |
|---|---|---|---|
| 4,521,446 | * 6/1985 | Coleman, Jr. et al. | 427/86 |
| 5,132,745 | * 7/1992 | Kwasnick et al. | 357/4 |
| 5,153,690 | * 10/1992 | Tsukada et al. | 357/23.7 |
| 5,267,194 | * 11/1993 | Jang | 257/327 |
| 5,424,229 | * 6/1995 | Oyamatsu | 437/35 |
| 5,559,733 | * 9/1996 | McMillan et al. | 365/145 |
| 5,874,745 | * 2/1999 | Kuo | 257/59 |
| 5,900,657 | * 5/1999 | Merrill | 257/296 |
| 6,060,749 | * 5/2000 | Wu | 257/347 |
| 6,087,208 | * 7/2000 | Krivokapic et al. | 438/183 |

FOREIGN PATENT DOCUMENTS

360208837 * 10/1985 (JP) ............... 438/FOR 492

OTHER PUBLICATIONS

Stanley Wolf and Richard N. Tauber; *Silicon Processing for the VLSI Era*, vol. 2—Process Integration; pp. 144–145, 354–355 and 437; 1990.

Stanley Wolf and Richard N. Tauber; *Silicon Processing for the VLSI Era*, vol. 3—The Submicron MOSFET; pp. 597–598, 608–611 and 634–636; 1995.

* cited by examiner

Primary Examiner—Tom Thomas
Assistant Examiner—Douglas W. Owens
(74) Attorney, Agent, or Firm—Timothy M. Honeycutt

(57) ABSTRACT

An integrated circuit and a method of making a transistor thereof are provided. In one aspect, the method includes the steps of forming a gate insulating layer on the substrate with a first outwardly tapered sidewall and a second outwardly tapered sidewall. A gate electrode is formed on the gate insulating layer. A first source/drain region and a second source/drain region are formed in the substrate by implanting ions into the substrate, wherein a first portion of the ions passes through the first sidewall and a second portion of the ions passes through the second sidewall. The method provides for incorporation of spacer-like structure into a gate dielectric layer. Conventional spacer fabrication may be eliminated and graded source/drain regions established with a single implant.

23 Claims, 2 Drawing Sheets

HIGH K INTEGRATION OF GATE DIELECTRIC WITH INTEGRATED SPACER FORMATION FOR HIGH SPEED CMOS

BACKGROUND OF THE INVENTION

1. Field of the Invention

This invention relates generally to semiconductor processing, and more particularly, to an integrated circuit with transistors, and to a method of making the same incorporating gate insulating layers with sloped sidewalls.

2. Description of the Related Art

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on the gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain, one implant to establish lightly doped drain structures and the other to establish overlapping heavier doped regions. The substrate is then annealed to activate the dopant in the source and the drain. Salicidation steps frequently follow the formation of the source and drain.

Lightly doped drain structures ("LDD") are one of the most commonly employed semiconductor processing techniques to establish graded source/drain regions for field effect transistors. As with other types of graded drain techniques, the objective behind the incorporation of LDD structures is the reduction of gate-to-substrate potential and the resulting hot carrier phenomena that can arise in short channel devices. The first implant is performed self-aligned to the gate electrode to establish the LDD structures. After the LDD implant, dielectric sidewall spacers are formed adjacent to the gate electrode. The second of the two source/drain implants is then performed self-aligned to the sidewall spacers.

Conventional LDD/spacer processing present certain disadvantages. To begin with, LDD fabrication by ion implantation often requires at least two separate implant steps, one for the LDD structures, and one for overlapping heavier doped regions. Each implant involves separate set up and wafer handling steps, and their corresponding impacts on throughput. In addition, spacer fabrication introduces processing complexity and some potential device performance issues. Oxide based spacers are typically fabricated by first establishing a conformal layer of oxide on the gate electrode either by oxidizing the gate electrode or by blanket chemical vapor deposition ("CVD"). The conformal oxide layer is then anisotropically etched to remove oxide from the flat areas of the substrate and the gate electrode and leave spacers adjacent to the gate electrode. Silicon nitride spacers are commonly fabricated in similar fashion by blanket low pressure or plasma enhanced CVD followed by an anisotropic etch. Thermally grown oxide spacers introduce the potential for grade gate oxide ("GGO") fingers to form and penetrate laterally at the gate-gate oxide interface. GGO fingers can cause undesirable gaps between the edges of the LDD structures and the edges of the gate electrode, which may lead to a weak overlap condition. Even larger gaps will arise between the edges of the heavier doped regions of the source/drain regions and the edges of the gate electrode. Although a deep drive anneal may reduce the widths of the gaps, such a high temperature step may lead to source/drain junctions with depths that are unsuitable for a transistor, particularly if implemented in CMOS. This problem may be present even if CVD oxide is used for spacers in situations where a poly-reoxidation step precedes the CVD oxide step.

The CVD oxide step to create silicon dioxide spacers typically produces a thicker oxide film at the edge of the gate-to-active area step than on flat areas. Thus, a subsequent anisotropic dry-etch process will clear the oxide in the flat areas while leaving spacers at the sidewalls of the poly gate. Some overetch is almost always necessary to account for variations in the spacer oxide layer thickness. The overetch frequently consumes some of the silicon substrate in the source/drain regions as well as any surrounding isolation structures, such as field oxide and/or shallow trench isolation material. Excessive overetching of these regions is undesirable from both device isolation and junction leakage standpoints.

In addition to the drawbacks associated with conventional LDD/spacer fabrication, various aspects of gate dielectric formation in conventional transistor fabrication present disadvantages. Silicon dioxide gate oxide layers are made as thin as possible to maximize drive current and to control short channel effects. The requirement for very thin gate oxide layers has become particularly important in sub-micron processing where process scaling has dramatically increased the potential for short channel effects. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot-carrier-injection degradation increases. Hot carrier degradation can significantly reduce device performance, while dielectric breakdown can lead to complete device failure.

The present invention is directed to overcoming or reducing the effects of one or more of the foregoing disadvantages.

SUMMARY OF THE INVENTION

In accordance with one aspect of the present invention, a transistor on a substrate is provided. The transistor includes a gate insulating layer positioned on the substrate. The gate insulating layer has a first sidewall and a second sidewall which are outwardly tapered. A gate electrode is positioned on the gate insulating layer. A first source/drain region is positioned in the substrate and has a first portion positioned beneath the first sidewall, and a second source/drain region is positioned in the substrate and has a second portion positioned beneath the second sidewall.

In accordance with another aspect of the present invention, an integrated circuit is provided that includes a substrate and a plurality of transistors positioned on the substrate. Each of the plurality of transistors includes a gate insulating layer positioned on the substrate that has a first sidewall and a second sidewall where the first and second sidewalls are outwardly tapered. A gate electrode is positioned on the gate insulating layer. A first source/drain region is positioned in the substrate and has a first portion positioned beneath the first sidewall. A second source/drain region is positioned in the substrate and has a second portion positioned beneath the second sidewall.

In accordance with another aspect of the present invention, a transistor on a substrate is provided that includes a gate insulating layer that is positioned on the substrate and has a first sidewall and a second sidewall. The first and second sidewalls are outwardly tapered and sloped about 10 to 80 degrees from vertical. A gate electrode is positioned on the gate insulating layer. A first source/drain region is positioned in the substrate and has a first lightly doped drain structure positioned beneath the first sidewall. A second source/drain region is positioned in the substrate and has a second lightly doped drain structure positioned beneath the second sidewall.

In accordance with another aspect of the present invention, a method of fabricating a gate insulating layer on a substrate is provided that includes the steps of forming an insulating layer on the substrate and masking a portion of the insulating layer. The insulating layer is directionally etched to establish a first outwardly tapered sidewall and a second outwardly tapered sidewall of the insulating layer.

In accordance with another aspect of the present invention, a method of fabricating a transistor on a substrate is provided that includes the steps of forming a gate insulating layer on the substrate with a first outwardly tapered sidewall and a second outwardly tapered sidewall. A gate electrode is formed on the gate insulating layer. A first source/drain region and a second source/drain region are formed in the substrate by implanting ions into the substrate, wherein a first portion of the ions passes through the first sidewall and a second portion of the ions passes through the second sidewall.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
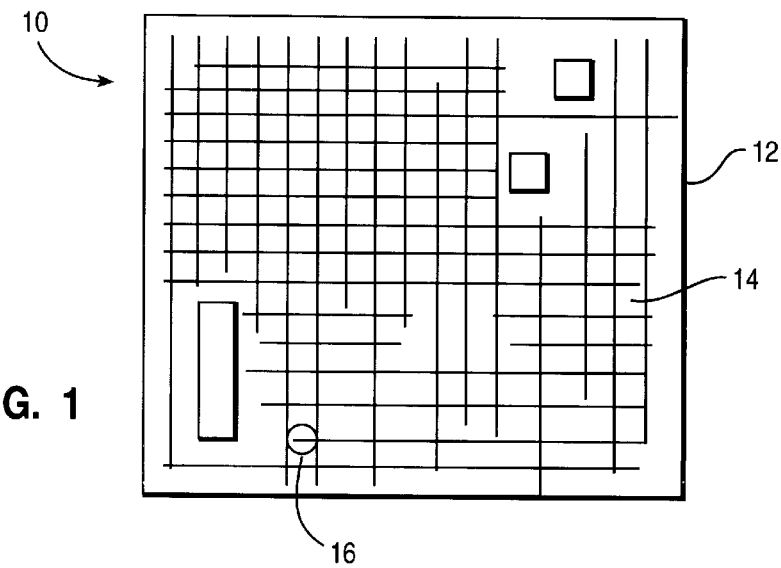
FIG. 1 is a plan view of an exemplary embodiment of an integrated circuit in accordance with the present invention.

In the drawings described below, reference numerals are generally repeated where identical elements appear in more than one figure. Turning now to the drawings, and in particular to FIG. 1, there is shown a plan view of an exemplary embodiment of an integrated circuit 10 that is fabricated on a semiconductor substrate 12 and includes a plurality of circuit devices that are schematically represented and collectively designated 14. The devices 14 may consist of a variety of different types of electronic circuit devices, such as, for example, transistors, capacitors, resistors and the like. The substrate 12 may be composed of n-type silicon, p-type silicon, silicon-on-insulator or other suitable substrate material. In an exemplary embodiment, the substrate 12 is composed of a base of monocrystalline silicon with an upper layer of epitaxial monocrystalline p-type silicon.

Figure 2:
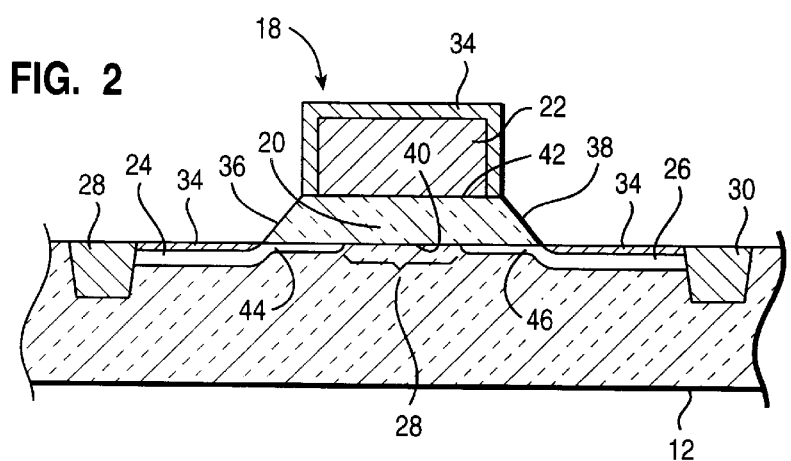
FIG. 2 is a highly magnified cross-sectional view of a transistor of the integrated circuit depicted in FIG. 1 in accordance with the present invention.

The detailed structure of an exemplary transistor of the integrated circuit 10 may be understood by referring now also to FIG. 2, which is a highly magnified cross sectional view of a small portion of the integrated circuit 10 generally circumscribed by the circle 16 shown in FIG. 1. The transistor is designated 18 in FIG. 2 and includes a gate insulating layer 20 positioned on the substrate 12, a gate electrode 22 positioned on the gate dielectric layer 20 and source/drain regions 24 and 26 positioned in the substrate 12 and separated laterally to define a channel region 28 in the substrate 12. The phrase "source/drain region(s)" is used herein to describe a region that may serve as either a source or a drain. The skilled artisan will appreciate that a source/drain region may function as a source or a drain depending upon how it is interconnected with subsequent metallization. The transistor 18 is electrically isolated prior to metallization by isolation structures 30 and 32, which may consist of separate isolation structures or the visible portions of an overall moat-like structure. Enhanced ohmic contact between the source/drain regions 24 and 26, the gate electrode 22 and any subsequent metallization is provided by a silicide layer 34 formed on the source/drain regions 24 and 26 and the gate electrode 22.

The gate insulating layer 20 is deliberately fabricated with a structure that is different than conventional gate oxide layers, which have substantially vertical sidewalls. In this regard, the gate insulating layer 20 is provided with opposing sidewalls 36 and 38 that are outwardly tapered, that is, tapered such that the gate insulating layer 20 is wider at its base 40 than at its top surface 42. In addition, the gate insulating layer 20 is advantageously composed of a relatively high dielectric constant material, preferably with a dielectric constant κ greater than that of silicon dioxide. As used herein, the phrase "composed of" is not intended to exclude the incorporation of other constituents in a given layer. With a higher dielectric constant, the gate insulating layer 20 may be fabricated with greater thicknesses than possible with conventional $SiO_2$ without sacrificing a desirably thin equivalent thickness of oxide ("$t_{ox}$"). The integration of a high κ material with outwardly tapered sidewalls 36 and 38 enables the gate insulating layer 20 to serve the dual role of gate dielectric and sidewall spacers.

The grading of the source/drain regions 24 and 26 mentioned above is provided by LDD structures 44 and 46. As described more fully below, the LDD structures are formed in the substrate 12 by ion implantation, wherein portions of the impurity ions pass through the outwardly tapered sidewalls 36 and 38 of the gate insulating layer 20.

Figure 3:
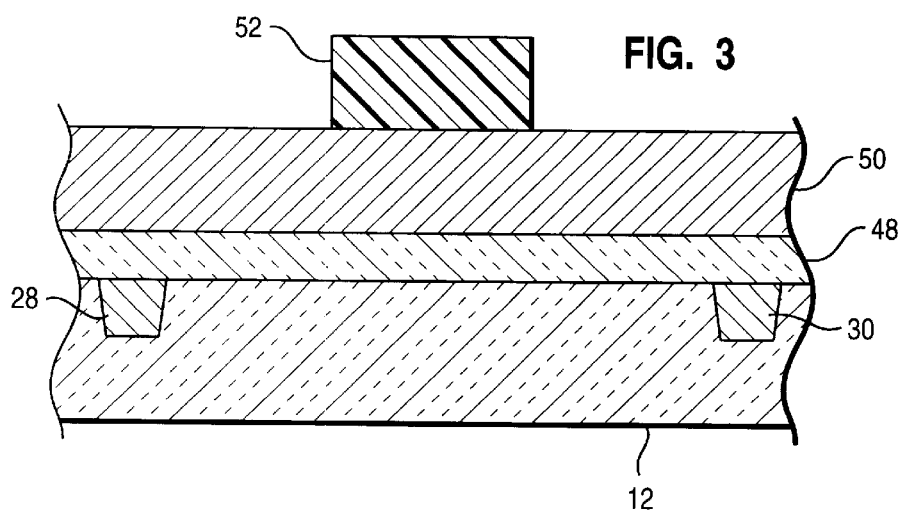
FIG. 3 is a cross-sectional of a substrate depicting formation of stacked insulating and conductor layers thereon in accordance with the present invention.

An exemplary process flow for fabricating the transistor 18 in accordance with the present invention may be understood by referring now to FIGS. 3, 4, 5 and 6, and initially to FIG. 3. FIG. 3 is a cross sectional view of the semiconductor substrate 12. The exemplary process will be described in the context of an n-channel transistor. However, the skilled artisan will appreciate that the process of the present invention may be applied to n-channel, p-channel or other types of transistors. Initially, the isolation structures 28 and 30 are fabricated in the substrate 12. The structures 28 and 30 may be shallow trench isolation structures, field oxide regions, or other types of commonly used isolation structures. In an exemplary embodiment, the structures 28 and 30 consist of a shallow trench isolation structures and may be fabricated using well known damascene etch and refill techniques. The structures 28 and 30 may be composed of a variety of suitable materials for isolation structures, such as silicon dioxide, silicon nitride or the like.

Next, an insulating layer 48 is formed on the substrate 12. Through subsequent processing, the layer 48 will be patterned to yield the gate insulating layer 20 shown in FIG. 2. As used herein, the terms "formed on", "disposed on" or "positioned on" should be construed to include the possibility that a given layer or structure may be formed on another given layer or structure with a third or other intervening layers or structures disposed between the two. The insulating layer 48 may be composed of a conventional gate dielectric material, such as $SiO_2$, but is advantageously composed of a material with a relatively high dielectric constant κ that yields a relatively thin $t_{ox}$ and exhibits resistance to dielectric breakdown and hot-carrier degradation. Exemplary materials include barium titanate ($BaTiO_3$), strontium titanate ($SrTiO_3$), $TiO_2$, $Ta_2O_5$, or like materials. In an exemplary embodiment, the layer 48 is composed of $BaTiO_3$ and may be formed by depositing a conformal layer of barium and titanium on the substrate 12. The deposition may be via CVD, sputter or other like techniques.

The layer of barium-titanium is then converted to $BaTiO_3$ by annealing in an oxygen containing ambient. The anneal may be conducted under a variety of conditions. For example, a rapid thermal anneal ("RTA") may be conducted with an ambient of about 50% $O_2$ and a like percentage of an inert gas, such as argon, at about 850 to 1050° C. for about 15 to 30 seconds. The concentration of the inert gas, such as argon, may be varied to control the oxidation rate of the barium-titanium to a desired level. Alternatively, the anneal may be accomplished in a diffusion tube furnace process at about 700 to 800° C. for about 15 minutes.

The mathematical relationship between the targeted equivalent $t_{ox}$ for the layer 48 and the actual thickness of the $BaTiO_3$ layer 48 is given by the following equation:

$$\frac{\kappa_{BaTiO_3}}{\kappa_{SiO_2}} \cdot (\text{Equivalent } t_{ox}) \cong (\text{Thickness of } BaTiO_3 \text{ layer}) \quad \text{Equation 1}$$

where $\kappa_{BaTiO_3}$ and $\kappa_{SiO_2}$ are the dielectric constants for $BaTiO_3$ and $SiO_2$. Note that the equation is expressed as an approximation since both $BaTiO_3$ and $SiO_2$ are isotropic materials with a range of dielectric constants instead of a single value. Furthermore, the range or single value of κ for a given material is also dependent upon measurement conditions, e.g., constant strain or unclamped, temperature and frequency. For example, $BaTiO_3$ has a constant strain dielectric constant $\kappa_{BaTiO_3}$ that may range from about 80 to 2300 at 298° K and 2.5E8 Hz. Similarly, $SrTiO_3$ has a constant strain dielectric constant that may range from about 332 at 298° K and 1.0E3 Hz to 2080 at 78° K and 1.0E3 Hz.

A desirable $t_{ox}$ of about 5 to 30 Å is yielded by a $BaTiO_3$ layer 48 ($\kappa_{BaTiO_3}$ of 80) with a thickness of about 87 to 437 Å. The gate insulating layer 20 subsequently patterned from the layer 48 exhibits not only a very thin equivalent $t_{ox}$, but also better resistance to dielectric breakdown and hot-carrier degradation than conventional gate oxide.

The application of the layer 48 has been described in the context of metal deposition followed by oxidation. However, the skilled artisan will appreciate that other techniques may be used. For example, the layer 48 may be applied as an oxide, e.g., $BaTiO_3$ by CVD, sputter or like techniques.

Still referring to FIG. 3, a conductor layer 50 is blanket deposited on the insulating layer 48. Through subsequent processing to be described below, the conductor layer 50 will be patterned to yield the gate electrode 22 shown in FIG. 2. Accordingly, the conductor layer 50 may advantageously be composed of a variety of materials suitable for transistor gate electrodes, such as, for example, polysilicon, tungsten, tantalum, aluminum, or the like. In an exemplary embodiment, the conductor layer 50 is composed of polysilicon and may be deposited by well known CVD techniques to a thickness of about 1000 to 2000 Å. The layer 50 may be planarized as desired by CMP. A later implant will render the polysilicon conductive.

Figure 4:
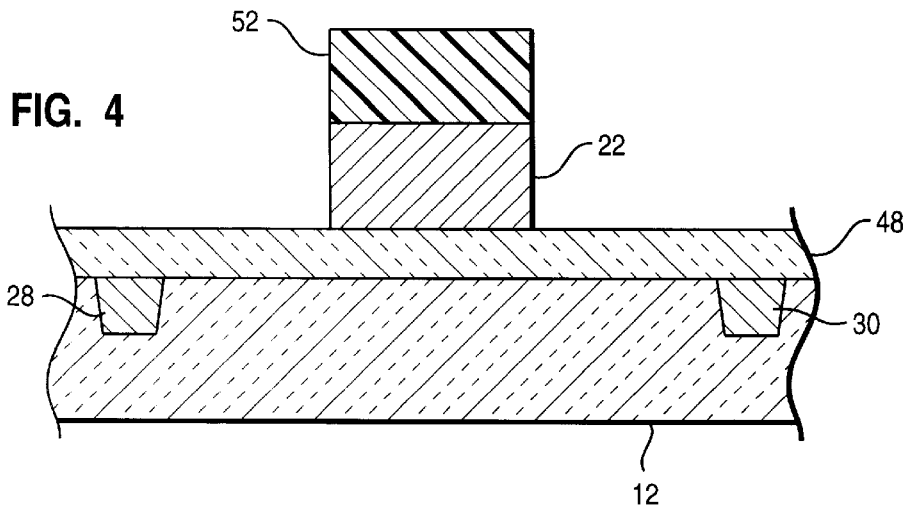
FIG. 4 is a cross-sectional view like FIG. 3 depicting etch definition of a gate electrode from the conductor layer in accordance with the present invention.

The fabrication of the gate electrode 22 may be understood by referring now to FIGS. 3 and 4. Initially, and as shown in FIG. 3, a photomask 52 is applied and patterned on the conductor layer 50. As shown in FIG. 4, the conductor layer 50 is anisotropically etched to yield the patterned gate electrode 22. The anisotropic etch may be performed using reactive ion etching ("RIE"), chemical plasma etching or other suitable anisotropic etching techniques using a chemistry that is selective to the underlying insulating layer 48, such as, for example, $C_2F_6$.

Figure 5:
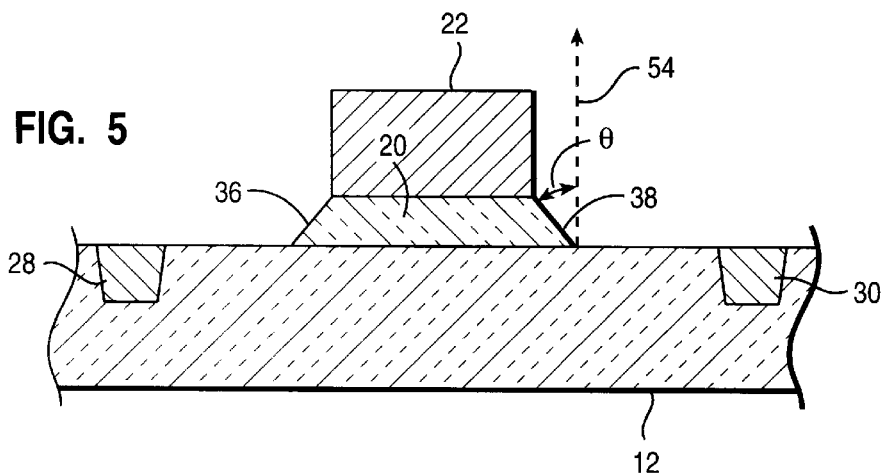
FIG. 5 is a cross-sectional view like FIG. 4 depicting directional etching of the insulating layer to yield a gate insulating layer with outwardly tapering sidewalls in accordance with the present invention.

The patterning of the insulating layer 48 to yield the gate insulating layer 20 shown in FIG. 2 may be understood by referring now to FIGS. 4 and 5. The photoresist 52 shown in FIG. 4 is stripped by ashing or like techniques and the insulating layer 48 is directionally etched to the substrate 12 to yield the patterned gate insulating layer 20 with the outwardly tapered sidewalls 36 and 38. The sidewalls 36 and 38 are patterned with a slope that is represented by the angle θ between a given sidewall, such as the sidewall 38, and vertical as represented by the upwardly projecting arrow 54 in FIG. 5. The angle θ advantageously has a value of between about 10 and 80°. During the etch, the gate insulating layer 20 is masked by the gate electrode 22. Note, however, that the masking of the gate insulating layer 20 may be accomplished by applying a masker thereto, such as a patterned photoresist.

The gate insulating layer 20 and the tapered sidewalls 36 and 38 may be patterned from the insulating layer 48 by wet directional etching, or by dry directional etching with or without plasma or reactive ion enhancement. In an exemplary embodiment of the process of the present invention, a reactive ion directional dry etch process utilizing a mixture of one or more etchant species and one or more diluting species is used. In this exemplary embodiment, the etch ambient consists of an initial mixture of about 90 wt % $CHF_3$ and about 10 wt % He. This initial mixture etches with a relatively high degree of anisotropicity. However, the concentration of $CHF_3$ is decreased to about 20 wt % and the concentration of He increased to about 45 wt % over a time interval, T, to yield the sloped sidewalls 36 and 38 with a slope angle θ of about 60°. The value of the time interval T is a function of the thickness of the layer 48. In this illustration, the etch is carried out with an interval T of about 70 seconds.

In order to establish relatively uniformly sloped sidewalls 36 and 38, the time interval T is subdivided into several equal sub-intervals, $t_0, t_1 \ldots t_7$, and the concentrations of the etchant constituents are changed at the end of each sub-interval. The following table summarizes the variations in concentrations relative to time:

| Time (s) | CHF$_3$ Concentration (wt %) | He Concentration (wt %) |
|---|---|---|
| $t_0 = 0$ | 90 | 10 |
| $t_1 = 10$ | 80 | 15 |
| $t_2 = 20$ | 70 | 20 |
| $t_3 = 30$ | 60 | 25 |
| $t_4 = 40$ | 50 | 30 |
| $t_5 = 50$ | 40 | 35 |
| $t_6 = 60$ | 30 | 40 |
| $t_7 = 70$ | 20 | 45 |

The total interval, T, as well as the number of sub-intervals are largely a matter of design discretion. However, the smoothness of the sidewalls 36 and 38 will generally increase if the number of sub-intervals is increased.

If more highly sloped sidewalls 36 and 38 are desired, the concentration of the diluting species, in this case He, is not ramped as high during the etch. For example, the He concentration may be increased from an initial value of about 10 wt % to only about 30 wt % during the interval T to yield a slope angle θ of about 75°. Conversely, if a more shallow slope is desired, the He concentration is started higher, at about 30 wt % for example, and then ramped higher over the time interval T to yield a slope angle θ of about 25°. In general the concentration of CHF$_3$ may be decreased from about 90 wt % to between about 90 and 20 wt % and the concentration of the He being increased from about 10 wt % to between about 10 to 90 wt %. In this way, the slope angle θ may be easily tailored between about 10° and about 80° as desired.

Figure 6:
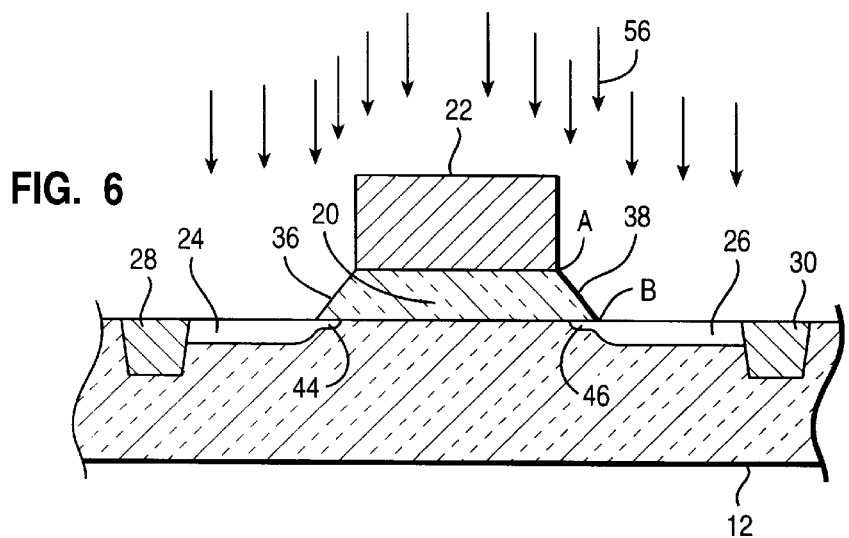
FIG. 6 is a cross-sectional view like FIG. 5 depicting implantation to establish source/drain regions in the substrate in accordance with the present invention.

The fabrication of the source/drain regions 24 and 26 may be understood by referring now to FIG. 6. Impurity ions, represented by the arrows 56, are implanted into the substrate 12. The bulk of the impurity ions 56 will pass directly into the substrate 12 and establish the majority and heavier doped portions of the source/drain regions 24 and 26. However, one portion of the impurity ions 56 will pass through the sidewall 36 before penetrating into the substrate 12 and a second portion of the ions 56 will pass through the sidewall 38 before penetrating into the substrate 12. Those portions of the ions 56 passing through the sidewalls 36 and 38 will establish the LDD structures 44 and 46. As a result of the outwardly tapering character of the sidewalls 36 and 38, the LDD structures 44 and 46 will be automatically established with graded doping and junction depth. The concept is illustrated with respect to the sidewall 38 and the points A and B on the sidewall 38. Those impurity ions 56 striking the sidewall 38 at the point A must travel through the entirety of the thickness of the gate insulating layer 20 before penetrating the substrate 12. Accordingly, the junction in the substrate 12 beneath the point A will be very shallow, whereas those ions striking the sidewall 38 nearer to the point B of the sidewall 38 will pass through only a relatively thin portion of the gate insulating layer 20 before penetrating the substrate 12. Consequently, the junction depth beneath the point B will be correspondingly deeper. In addition, the dopant concentration in the substrate beneath point A will be relatively lighter than the concentration beneath point B due to the increased propensity for interatomic collisions that results from ions passing through a much greater amount of material before entering the substrate 12.

Suitable energies and dosages for the implant will depend in large part upon the impurity species and the thickness of the gate insulating layer 20. In the illustrated embodiment, arsenic may be implanted with an energy of about 10 to 100 keV and a dosage of about 2E15 to 1E16 cm$^{-2}$. The implant may be on axis. The skilled artisan will appreciate that the process of the present invention enables the source/drain regions 26 and 28 to be fabricated with grading using a single implant.

The fabrication of the silicide layer 34 may be understood by referring again to FIG. 2. A layer of silicide-forming metal may be blanket deposited on the substrate 12 by physical vapor deposition ("PVD"), CVD or other well known techniques. A silicide-forming reaction is initiated between the metal and the substrate 12, and, if the gate electrode 22 is composed of polysilicon, also with the gate electrode 22. A variety of materials may be used to establish the silicide layer 34, such as, for example, cobalt, titanium, platinum, palladium, nickel, tungsten, tantalum, molybdenum, combinations of these or the like. In an exemplary embodiment, relatively pure cobalt is deposited to a thickness of about 200 to 500 Å by PVD and a two stage anneal is applied. The initial heating step may be performed at about 400 to 600° C. for about 30 to 120 seconds in an RTA with an inert ambient of argon or nitrogen. This first heating step establishes the silicide layer 34 on the source/drain regions 24 and 26 and the gate electrode 22. As the silicide reaction is consumptive of silicon and polysilicon, the layer 34 partially invades the source/drain regions 24 and 26 and the gate electrode 22 as shown in FIG. 2. Note that this reaction will not occur at the gate 22, where the gate 22 is composed of a material that will not form silicide.

Any unreacted metal remaining after the silicide reaction is removed by wet etching. For example, an HCl-peroxide dip with about a 3:1 ratio by volume, or an H$_2$SO$_4$-peroxide dip with about a 3:1 ratio by volume may be used. A second anneal is performed to stabilize the silicide layer 34. The stabilizing anneal may be performed at about 600 to 900° C. for about 30 to 120 seconds, again in an RTA process.

The high temperature steps to fabricate the silicide layer 34 may serve to anneal and activate the source/drain regions 24 and 26. If desired, a separate anneal step may be performed at about 700 to 850° C. for about 5 to 15 seconds in a RTA or about 5 to 15 minutes in a furnace process. In either case, the high temperature processing will result in some overlap between the LDD structures 44 and 46 and the edges of the gate electrode 22.

The skilled artisan will appreciate that the process of the present invention enables reliable fabrication of a gate insulating layer and a transistor incorporating the same in a spacerless process that utilizes only a single implant to establish graded source/drain regions. The incorporation of a high κ material for the gate insulating layer enables desirable physical height to be fabricated into the gate electrode/gate insulating layer stack without sacrificing a desirably thin equivalent $t_{ox}$. Spacer functionality is directly integrated into the structure of the gate insulating layer, eliminating the various process steps using conventional processing to fabricate sidewall spacers. Significant savings in material cost and processing throughput may be realized.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A transistor on a substrate, comprising:
   a gate insulating layer positioned on the substrate and having a first sidewall and a second sidewall, the first and second sidewalls being outwardly tapered;

a gate electrode positioned on the gate insulating layer;

a first source/drain region positioned in the substrate and having a first portion positioned beneath the first sidewall; and a second source/drain region positioned in the substrate and having a second portion positioned beneath the second sidewall.

2. The transistor of claim 1, comprising an n-channel device.

3. The transistor of claim 1, comprising a p-channel device.

4. The transistor of claim 1, wherein the gate insulating layer has a dielectric constant greater than about 5.

5. The transistor of claim 4, wherein the gate insulating layer comprises $BaTiO_3$, $SrTiO_3$, $TiO_2$, or $Ta_2O_5$.

6. The transistor of claim 1, wherein the first and second sidewalls are sloped about 20 to 70 degrees from vertical.

7. The transistor of claim 1, wherein the first and second portions of the first and second source/drain regions comprise lightly doped drain structures.

8. The transistor of claim 1, comprising a silicide layer on the first and second source/drain regions.

9. An integrated circuit, comprising:

a substrate; and a plurality of transistors positioned on the substrate, each of which has a gate insulating layer positioned on the substrate and having a first sidewall and a second sidewall, the first and second sidewalls being outwardly tapered, a gate electrode positioned on the gate insulating layer, a first source/drain region positioned in the substrate and having a first portion positioned beneath the first sidewall, and a second source/drain region positioned in the substrate and having a second portion positioned beneath the second sidewall.

10. The integrated circuit of claim 9, wherein the transistors comprise n-channel devices.

11. The integrated circuit of claim 9, wherein the transistors comprise p-channel devices.

12. The integrated circuit of claim 9, wherein a first portion of the transistors comprise n-channel devices and a second portion of the transistors comprise p-channel devices.

13. The transistor of claim 9, wherein the gate insulating layer has a dielectric constant greater than about 5.

14. The transistor of claim 13, wherein the gate insulating layer comprises $BaTiO_3$, $SrTiO_3$, $TiO_2$, or $Ta_2O_5$.

15. The transistor of claim 9, wherein the first and second sidewalls are sloped about 10 to 80 degrees from vertical.

16. The transistor of claim 9, wherein the first and second portions of the first and second source/drain regions comprise lightly doped drain structures.

17. The transistor of claim 9, comprising a silicide layer on the first and second source/drain regions.

18. A transistor on a substrate, comprising:

a gate insulating layer positioned on the substrate and having a first sidewall and a second sidewall, the first and second sidewalls being outwardly tapered and sloped about 10 to 80 degrees from vertical;

a gate electrode positioned on the gate insulating layer;

a first source/drain region positioned in the substrate and having a first lightly doped drain structure positioned beneath the first sidewall; and a second source/drain region positioned in the substrate and having a second lightly doped drain structure positioned beneath the second sidewall.

19. The transistor of claim 18, comprising an n-channel device.

20. The transistor of claim 18, comprising a p-channel device.

21. The transistor of claim 18, wherein the gate insulating layer has a dielectric constant greater than about 5.

22. The transistor of claim 21, wherein the gate insulating layer comprises $BaTiO_3$, $SrTiO_3$, $TiO_2$, or $Ta_2O_5$.

23. The transistor of claim 18, comprising a silicide layer on the first and second source/drain regions.

* * * * *